United States Patent
Cook et al.

(10) Patent No.: US 7,119,548 B1
(45) Date of Patent: Oct. 10, 2006

(54) CURRENT TRANSFORMER TEST DEVICE AND METHOD

(75) Inventors: John S. Cook, Tulsa, OK (US);
Randall D. Davis, Claremore, OK (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/274,073

(22) Filed: Nov. 14, 2005

(51) Int. Cl.
*G01R 31/06* (2006.01)

(52) U.S. Cl. ........................... 324/547; 324/546

(58) Field of Classification Search ............ 324/547
See application file for complete search history.

(56) References Cited

U.S. PATENT DOCUMENTS

| | | | |
|---|---|---|---|
| 1,972,243 A | 9/1934 | Nolke | |
| 2,527,568 A | 10/1950 | Murray | |
| 3,659,197 A | 4/1972 | Alley et al. | |
| 3,875,511 A | 4/1975 | Sims | |
| 3,932,811 A | 1/1976 | Branch | |
| 3,934,194 A * | 1/1976 | Paprocki | 324/547 |
| 4,849,690 A | 7/1989 | Hughes | |
| 4,851,766 A | 7/1989 | Shiobara et al. | |
| 4,973,902 A | 11/1990 | Dhyanchand et al. | |
| 5,396,172 A | 3/1995 | Lat et al. | |
| 5,457,402 A | 10/1995 | Sato | |
| 5,740,600 A | 4/1998 | Rasberry | |
| 5,907,244 A | 5/1999 | Crabill et al. | |
| 5,923,173 A * | 7/1999 | Yu | 324/547 |
| 6,184,690 B1 | 2/2001 | Fisher | |
| 6,466,064 B1 | 10/2002 | Kurogouchi et al. | |
| 6,611,771 B1 | 8/2003 | Habetler et al. | |
| 6,680,616 B1 | 1/2004 | Khalin et al. | |
| 6,809,525 B1 | 10/2004 | Sampat | |
| 6,903,556 B1 | 6/2005 | Sutton | |
| 2002/0060578 A1 | 5/2002 | White | |

FOREIGN PATENT DOCUMENTS

| | | |
|---|---|---|
| EP | 0279577 | 8/1988 |
| GB | 262598 | 12/1926 |
| JP | 2140669 | 5/1990 |
| JP | 2005024263 | 1/2005 |

* cited by examiner

*Primary Examiner*—Vincent Q. Nguyen
(74) *Attorney, Agent, or Firm*—Ingrassia Fisher & Lorenz (57) ABSTRACT

A current transformer test device and a method implemented using the test device, is useful to verify proper CT installation and operation, and does not rely on the generator (or other system) to be in a state of relatively high assembly. The test device allows a current transformer to be tested by supplying an alternating current (AC) signal to a primary winding of the current transformer to thereby induce an AC signal in a secondary winding of the current transformer. The test device is used to simultaneously monitor the phases of the supplied AC signal and the induced AC signal so that a determination can be made as to whether the current transformer secondary winding is properly installed relative to the current transformer primary winding, and to simultaneously monitor the current magnitudes of the supplied AC signal and the induced AC signal so that the turns ratio of the current transformer can be determined.

14 Claims, 5 Drawing Sheets

CURRENT TRANSFORMER TEST DEVICE AND METHOD

TECHNICAL FIELD

The present invention relates to alternating current (AC) generators and AC electrical distribution systems and, more particularly, to a device and method for testing current transformers installed in AC generators and AC electrical distribution systems.

BACKGROUND

Alternating current (AC) generators are used for myriad applications, for example, in a gas turbine engine, such as that found in aircraft, ships, and some terrestrial vehicles. These generators may include three separate brushless generators, namely, a permanent magnet generator (PMG), an exciter, and a main generator. Each of these generators may include rotors and stators. When the rotors rotate, AC current is induced in the associated stators. The AC current induced in the main generator stator is supplied to an electrical distribution system within, for example, the aircraft, ship, or terrestrial vehicle.

Many AC generators, such as the one described above, include one or more current transformers (CTs). The CTs sense, for example, the AC current in the main generator stator windings, and supply a signal representative of the AC current to a protection, monitor, and/or control circuit. These one or more circuits, using the signals from the CTs, may implement overload protection and/or generator control. Thus, the generator CTs are subjected to various tests upon installation to verify proper installation and operation.

Although current devices and methods for verifying proper installation and operation of generator CTs is safe, reliable, and accurate, these current devices and methods do suffer certain drawbacks. For example, with the exception of a "bench test" to verify resistance, the current devices and methods only allow CT verification testing to be conducted during generator functional testing, which is typically conducted after the generator is in a relatively high state of assembly. Thus, if the verification testing indicates that one or more of the CTs may be faulty, inoperable, or improperly installed, the generator may need to be substantially disassembled to correct the CT installation or replace the faulty CT, and then reassembled to once again conduct the CT verification testing. This can potentially result in increased labor time, which can concomitantly result in increased costs.

Hence, there is a need for a device and method of verifying proper CT installation and operation that does not rely on the generator (or other system) to be in a state of relatively high assembly. The present invention addresses at least this need.

BRIEF SUMMARY

The present invention provides a device and method of verifying proper CT installation and operation that does not rely on the generator (or other system) to be in a state of relatively high assembly.

In one embodiment, and by way of example only, a current transformer test device for testing a plurality of current transformers each having at least a primary winding and a secondary winding includes an alternating current (AC) power source, an AC current meter, a current transformer primary winding select switch, a current transformer primary winding test jack, and a current transformer secondary winding test jack. The AC power source is configured to supply an AC signal having at least a current magnitude. The AC current meter is configured to measure and display the supplied AC signal current magnitude. The current transformer primary winding select switch is movable to one of a plurality of switch positions. Each switch position corresponds to one of the plurality of current transformer primary windings. The current transformer primary winding test jack is coupled to receive the AC signal from the AC power source, and is configured to be releasably coupled to each of the current transformer primary windings and, upon being coupled thereto, to supply the AC signal to the current transformer primary winding that corresponds with the switch position of the current transformer select switch. The current transformer secondary winding test jack is configured to be releasably coupled to each of the current transformer secondary windings and, upon being coupled thereto, to receive a current transformer test signal from one of the current transformer secondary windings when its associated current transformer primary winding is supplied with the AC signal.

In another exemplary embodiment, a method of testing a current transformer includes supplying an alternating current (AC) signal to a primary winding of the current transformer to thereby induce an AC signal in a secondary winding of the current transformer, wherein the supplied AC signal and the induced AC signal each have at least a phase and a current magnitude. The phases of the supplied AC signal and the induced AC signal are simultaneously monitored to determine whether the current transformer secondary winding is properly installed relative to the current transformer primary winding, and the current magnitudes of the supplied AC signal and the induced AC signal are simultaneously monitored to determine a turns ratio of the current transformer.

In yet another exemplary embodiment, a method of testing a plurality of stator current transformers, each of which is installed in and configured to monitor an associated phase in a multi-phase stator, includes supplying an alternating current (AC) signal to one of the associated phases of the multi-phase stator to thereby induce an AC signal in the current transformer installed in the associated phase, wherein the supplied AC signal and the induced AC signal each having at least a phase and a current magnitude. The phases of the supplied AC signal and the induced AC signal are simultaneously monitored to determine whether the current transformer is properly installed relative to the associated stator phase, and the current magnitudes of the supplied AC signal and the induced AC signal are simultaneously monitored to determine a turns ratio of the current transformer. The previous steps are repeated for each of the plurality of current transformers and associated phases.

Other independent features and advantages of the preferred current transformer test device and method will become apparent from the following detailed description, taken in conjunction with the accompanying drawings which illustrate, by way of example, the principles of the invention.

DETAILED DESCRIPTION OF A PREFERRED EMBODIMENT

Before proceeding with the detailed description, it is to be appreciated that the present invention is not limited to use in conjunction with a specific type of electrical machine. Thus, although the present embodiment is, for convenience of explanation, depicted and described as being employed with a brushless AC (alternating current) generator, it will be appreciated that it can be used with other AC generator designs that include one or more current transformers (CTs), and may additionally be used with various distribution systems and devices that use CTs to monitor AC current flow through portions thereof.

Figure 1:
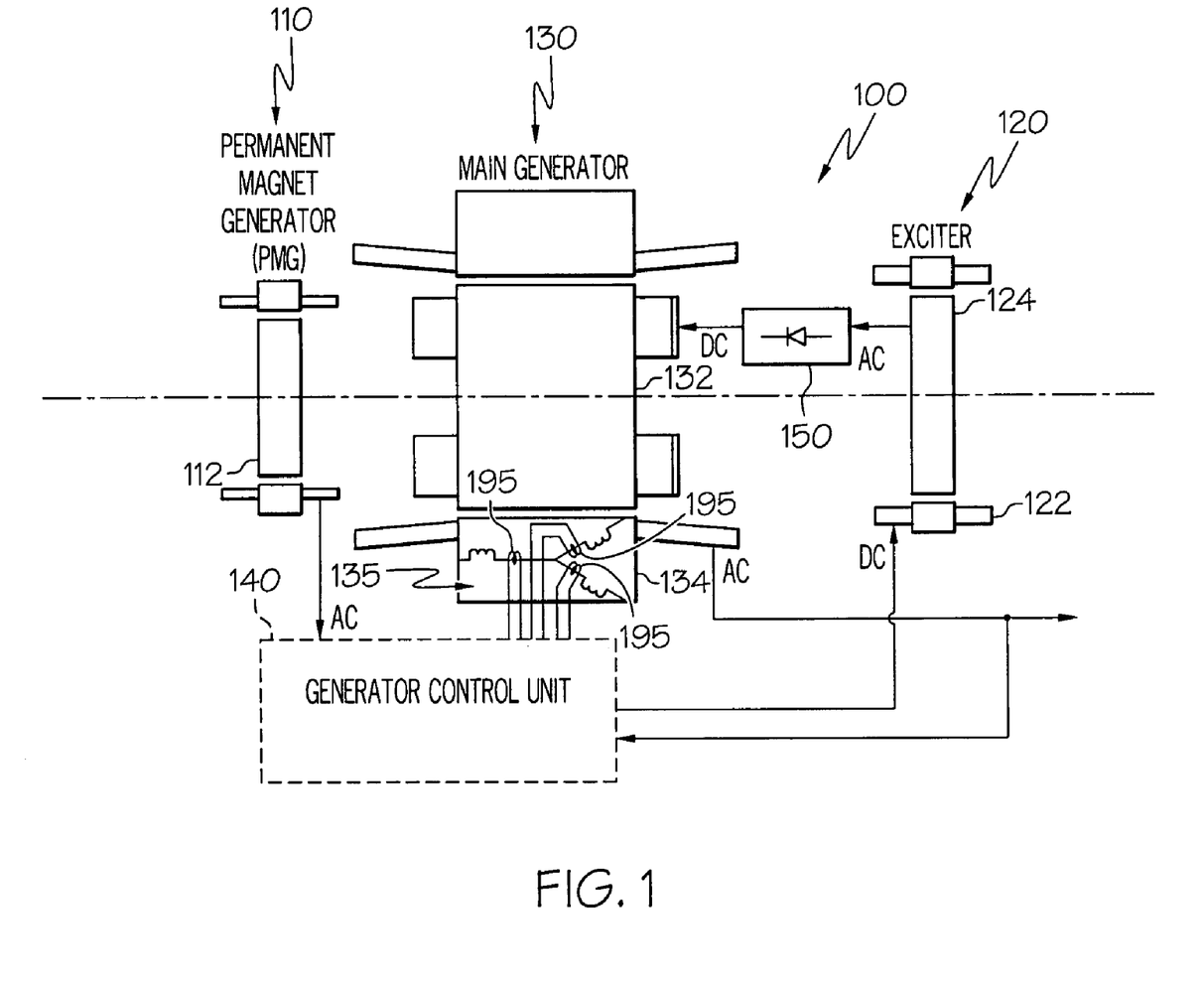
FIG. 1, a functional schematic block diagram of an exemplary high speed generator system 100.

Turning now to the description, and with reference first to FIG. 1, a functional schematic block diagram of an exemplary high speed generator system 100 for use with a gas turbine engine, such as that in an aircraft, is depicted. This exemplary generator system 100, which is commonly known as a brushless AC generator, includes a permanent magnet generator (PMG) 110, an exciter 120, a main generator 130, a generator control unit 140, and one or more rectifier assemblies 150. During operation, a rotor 112 of the PMG 110, a rotor 124 of the exciter 120, and a rotor 132 of the main generator 130 may all rotate at the same speed. In one embodiment, the rotational speed may be, for example, in the range of about 12,000 to about 24,000 r.p.m., or greater. As the PMG rotor 112 rotates, the PMG 110 generates and supplies AC power to the generator control unit 140, which in turn is rectified and supplied as direct current (DC) power to a stator 122 of the exciter 120. The exciter rotor 124 in turn supplies AC power to the rectifier assemblies 150. The output from the rectifier assemblies 150 is DC power and is supplied to the main generator rotor 132. As the main generator rotor 132 rotates, magnetic flux lines are created about alternating north and south poles which induce an AC voltage into stator windings 135 of the main generator stator 134.

Figure 2:
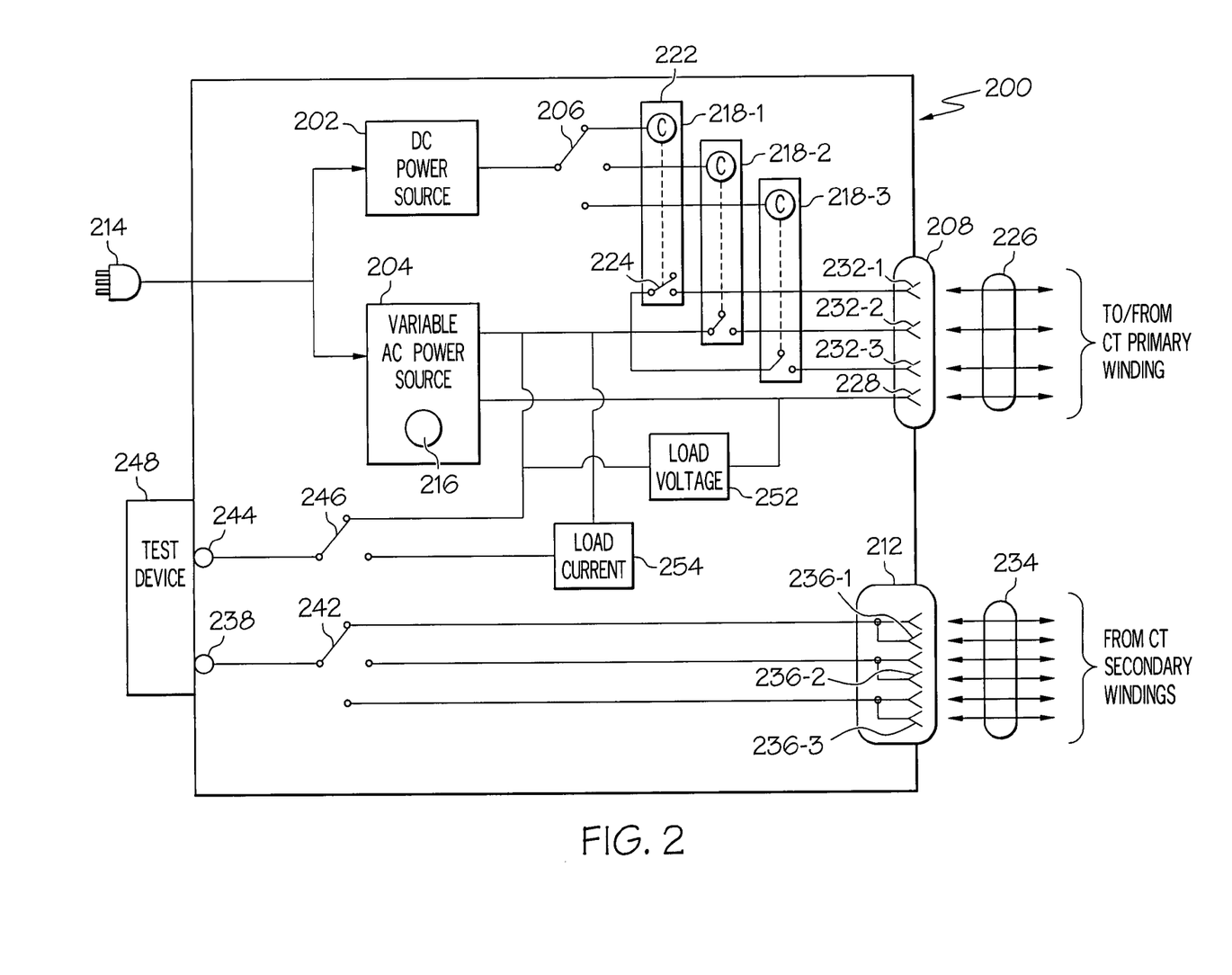
FIG. 2 is a functional block diagram of an exemplary test device that may be used to verify proper installation and operation of one or more current transformers installed, for example, in the generator of FIG. 1.

The generator system 100 is capable of providing output power at a variety of power levels and over a variety of frequency ranges. Further, typically the output power from the main generator stator 134 is three-phase AC power. The generator control unit 140 can regulate the power output and/or provide various protective functions based upon monitoring signals provided to it from a plurality of current transformers (CTs)s 195. More specifically, at least in the depicted embodiment, a CT 195 is provided and configured to monitor the AC current in each of the three stator windings 135. Thus, as was previously mentioned, it is desirable that the CTs 195 be installed and operating properly when the generator 100 is fully assembled. Moreover, as was also previously mentioned, it is desirable that proper CT installation and operation be verified before the generator 100 is in a relatively high state of assembly. With reference to FIG. 2, a functional block diagram of an exemplary test device 200 that may be used to verify proper installation and operation of the CTs 195 is depicted and will now be described.

The test device 200 includes a DC power source 202, a variable AC power source 204, a current transformer primary winding select switch 206, a current transformer primary winding test jack 208, and a current transformer secondary winding test jack 212. The DC power source 202 and the variable AC power source 204 are both adapted to receive AC power from a suitable non-illustrated external electrical power source via, for example, a conventional three-prong plug 214. When the plug 214 is coupled to a suitable AC power source, the DC power source 202, which is preferably a fixed DC power source, rectifies the AC power and supplies a fixed DC voltage. The variable AC power source 204, when the plug 214 is coupled to a suitable AC source, supplies an AC signal having a voltage magnitude that is controlled and set via a user interface 216 such as, for example, a user input knob.

The current transformer primary winding select switch 206 is a multi-position switch that is coupled between the DC power source 202 and a plurality of solenoids 218. The current transformer primary winding select switch 206 is configured, depending on its position, to selectively couple the DC power source 202 to, and thus energize, one of the plurality of solenoids 218. In the depicted embodiment, and as will be described in more detail further below, the test device 200 is preferably configured to be coupled to, and to selectively energize, three current transformers. Thus, the current transformer primary winding select switch 206 is a three-position switch, and the test device 200 includes three solenoids 218 (e.g., 218-1, 218-2, 218-3). It will be appreciated, however, that this is merely exemplary of a particular preferred embodiment, and that the current transformer primary winding select switch 206 could include more or less than this number of positions, and the test device 200 could be implemented with more or less than this number of solenoids 218.

No matter the specific number of solenoids 218 that are included, it is seen that each solenoid 218 includes a coil 222 and an associated contactor 224. Each coil 222 controls the position of its associated contactor 224. More specifically, when a coil 222 is energized from the DC power source 202, its associated contactor 224 is moved to a closed position, and when a coil is de-energized, its associated contactor 224 moves to an open position. It is seen that, at least in the depicted embodiment, when a contactor 224 is in the closed position, the AC signal from the AC power source 204 is coupled to the current transformer primary winding test jack 208.

The current transformer primary winding test jack 208 is configured to be coupled, via a test cable 226, to a plurality of current transformer primary windings (not shown). More specifically, the current transformer primary winding test jack 208 is a multi-pin connector that includes at least one common pin 228 and a plurality of supply pins 232, one for each current transformer to which the test device 200 is configured to be coupled. Although the test device 200 may be configured to be simultaneously coupled to various numbers of current transformers, in the depicted embodiment, the test device 200 is configured to be coupled to three current transformers. Therefore, the current transformer primary winding test jack 208 includes three supply pins 232-1, 232-2, 232-3. The common pin 228 is coupled to the variable AC power source 204, whereas each supply pin 232 is coupled to one of the solenoid contactors 224. Thus, the current transformer winding test jack 208 is used to couple the AC signal supplied from the variable AC power source 204 to the current transformer primary winding that corresponds with the switch position of the current transformer primary winding select switch 206.

The current transformer secondary winding test jack 212 configured to be coupled, via a second test cable 234, to a plurality of current transformer secondary windings (also not shown). The current transformer secondary winding test jack 212, like the current transformer primary winding test jack 208, is a multi-pin connector that includes a plurality of secondary winding connection pin pairs 236. Each secondary winding connection pin pair 234 is configured to receive a current transformer test signal from a current transformer secondary winding when its associated primary winding is supplied with an AC signal. Preferably, the current transformer secondary winding test jack 212 is configured to simultaneously couple the test device 200 to three current transformer secondary windings, and thus includes three secondary winding connection pin pairs 236-1, 236-2, 236-3. It will be appreciated, however, that this is merely exemplary and that the current transformer secondary winding test jack 212 could be configured to coupled the test device 200 to more or less than this number of current transformer secondary windings, and thus include more or less than this number of secondary winding connection pin pairs 236.

In addition to the above, it is seen that the test device 200 further includes a secondary winding test device node 238, a current transformer secondary winding select switch 242, a primary winding test device node 244, and an AC signal parameter select switch 246. The secondary winding test device node 238 is coupled to the current transformer secondary winding select switch 242 and is adapted to be coupled to a test device 248. Although the particular test device 248 may vary, the test device 248 is preferably an oscilloscope. Moreover, the secondary winding test device node 238 and the test device 248 may be configured to be either releasably or permanently coupled together. In a preferred embodiment, the secondary winding test device node 238 is implemented as a releasable connector, such as a BNC connector, that is configured to be releasably coupled to a test cable that is in turn coupled to the test device 248.

No matter the specific implementation of the secondary winding test device node 238 and the test device 248, it is seen that the current transformer secondary winding select switch 242 is coupled between the current transformer secondary winding test jack 212 and the secondary winding test device node 238. The current transformer secondary winding select switch 242 is a multi-position switch that is configured, depending on its position, to selectively couple one of the current transformer secondary winding test jack pin pairs 236 to the secondary winding test device node 238.

The primary winding test device node 244 is coupled to the AC signal parameter select switch 246 and is also adapted to be coupled to a test device. In the depicted embodiment, the primary winding test device node 244 is adapted to be coupled to the same test device 248 as the secondary winding test device node 238. It will be appreciated, however, that this is merely exemplary of a particular preferred embodiment, and that the test device nodes 238, 244 could, if so desired, be coupled to different test devices. If, as is preferable, the two test device nodes 238, 244 are coupled to the same test device 248, the test device 248 is preferably a multi-channel oscilloscope. In addition, similar to the secondary winding test device node 238, the primary winding test device node 244 may be configured to be either releasably or permanently coupled to the test device 248. In a preferred embodiment, the primary winding test device node 244 is also implemented as a a releasable connector, such as a BNC connector, that is configured to be releasably coupled to a test cable that is in turn coupled to the test device 248.

The AC signal parameter select switch 246 is coupled between the variable AC power source 204 and the primary winding test device node 244. The AC signal parameter select switch 242 is a multi-position switch that is configured, depending on its position, to selectively couple a signal representative of either the AC signal voltage or AC signal current that the variable AC power source is supplying to a selected current transformer primary winding. Both of these parameters are also visible on displays that are mounted on the test device. In particular, a load voltage indicator 252 and a load current indicator 254 are mounted on the device and provide a visual indication of the AC signal voltage and current magnitudes being drawn from the variable AC power source 204 by the selected current transformer primary winding. Although the current and voltage displays 252, 254 could be implemented as any one of numerous types of displays, preferably each is implemented using a digital display meter.

Figure 3:
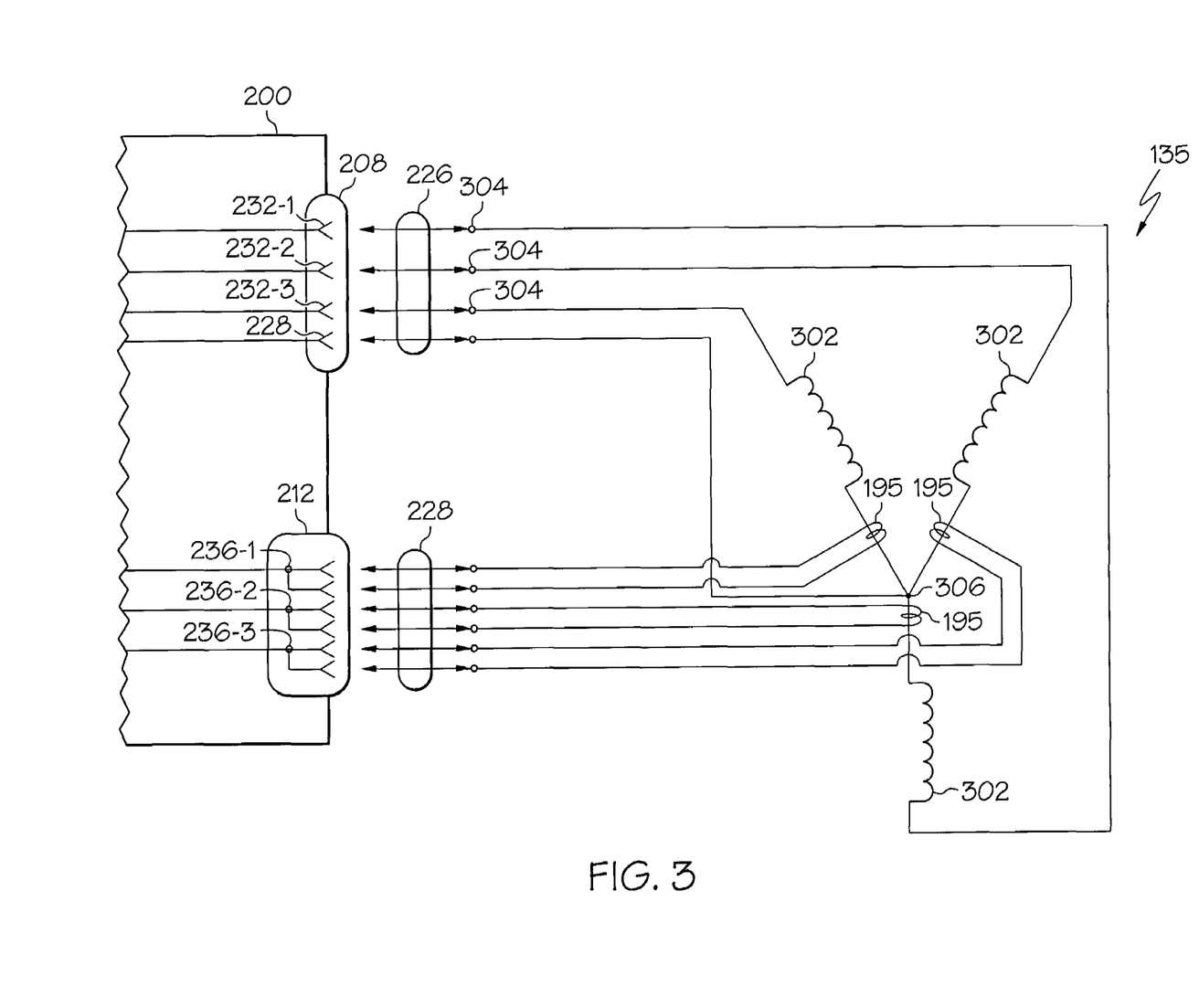
FIG. 3 schematically depicts the test device of FIG. 2 electrically coupled to a stator and current transformers of the exemplary generator of FIG. 1.

Turning now to FIG. 3, a brief description of how the test device 200 is connected to the CTs 195 of a 3-phase AC generator, such as the one depicted in FIG. 1 and described above, will now be provided. In doing so, reference should also be made, as needed or desired, to FIG. 2. As FIG. 3 shows, the stator windings 135, which function as current transformer primary windings, are coupled to the current transformer primary winding test jack 208 via the test cable 226, and the CTs 195 are each coupled to the current transformer secondary winding test jack 212 via the test cable 234. As FIG. 3 also shows, the main stator windings 135 are wound in a three-phase wye configuration, and thus includes three CTs 195, one CT 195 per phase 302. As is generally known, each phase 302 has a load end 304 and is coupled to the other phases 302 at a neutral node 306. Thus, as FIG. 3 also shows, the load end 304 of each phase 302 is electrically coupled to one of the current transformer primary winding test jack supply pins 232-1, 232-2, 232-3, and the neutral node 306 is coupled to the current transformer primary winding test jack common pin 228. Similarly, each of the CTs 195 is separately coupled to one of the secondary winding connection pin pairs 236-1, 236-2, 236-3.

With the above-described connections made, the test device 200 is preferably energized by coupling the plug 214 to a suitable AC source. Upon energization, the DC power source 202 supplies power to one of the solenoids 218, depending on the position of the current transformer primary winding select switch 206. In addition, the variable AC power source 204 supplies an AC signal to the stator phase 302 selected by the current transformer primary winding select switch 206, and at a voltage and current magnitude set via the user interface 216. The load voltage and load current magnitudes, as noted above, are displayed on the load voltage indicator 252 and the load current indicator 254, respectively. It will be appreciated that the user interface 216 is preferably manually manipulated to supply a sufficient load current to the selected stator winding phase 302 so that a sufficient current magnitude is induced in the associated CT 195. It will be appreciated that the specific load current magnitude that is supplied to the selected stator winding phase 302 may vary, but in a particular embodiment, it has been found that a current magnitude of about 20 amps is sufficient.

No matter the specific load current magnitude that is found sufficient, when the current is induced in the associated CT 195, the induced current can be monitored. More specifically, one channel of the test device 248, which as noted above is preferably a multi-channel oscilloscope, is coupled to the secondary winding test device node 238. Thus, when the current transformer secondary winding select switch 242 is positioned to select the associated CT 195, the test device 248 will display the AC signal induced in the associated CT 195. As was also noted above, a second channel of the test device 248 is coupled to the primary winding test device node 244. Thus, depending on the position of AC signal parameter select switch 246, either the AC load voltage signal or AC load current signal supplied to the associated stator phase 302 will also be displayed by the test device 248.

The test device 248 allows the AC voltage signal waveforms of the stator winding phases 302 and the associated CTs 195 to be monitored and compared. As a result, it is possible to determine if each of the CTs 195 have been properly installed and whether the installed CTs 195 have the proper turns ratio. In particular, by comparing the waveforms displayed on the test device 248, a determination can be made as to whether the stator winding phase waveform and the associated CT waveform are in phase or out of phase. If the waveforms are out of phase, this indicates that the associated CT 195 has been improperly installed. Moreover, by comparing the load current magnitude, using either the load current display 254 or the test device 248, to the AC voltage signal from the associated CT 195, the turns ratio of the CTs 195 can be accurately determined. For example, if a 50 amp load current is being supplied to a stator phase 302, and the associated CT 195 is designed to have a turns ratio of 500:1, the output current from the associated CT 195 should be 0.1 amps. If the current varies by more than a predetermined amount, then it is likely that the turns ratio of the CT 195 is incorrect.

Figure 4:
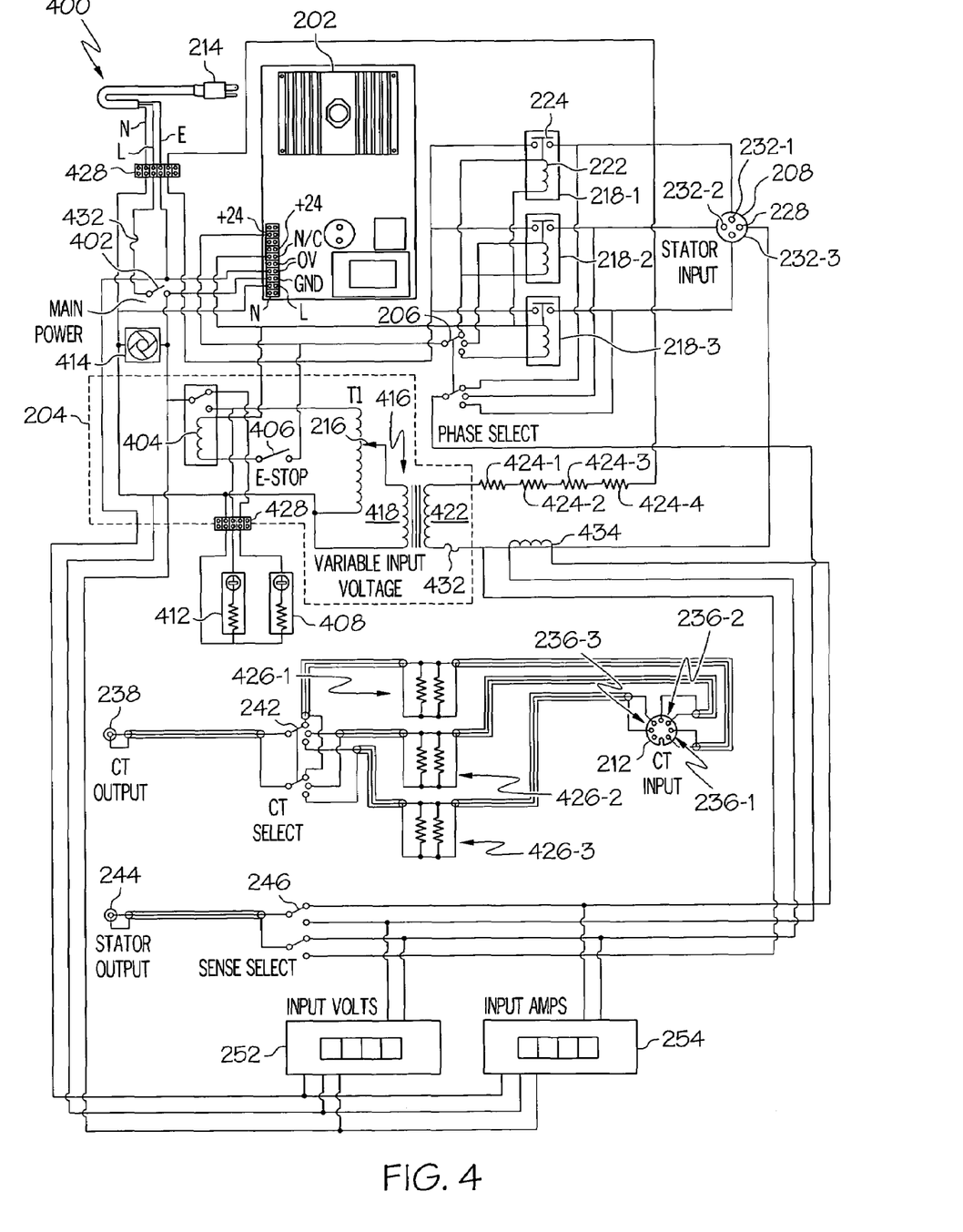
FIG. 4 is detailed schematic diagram of an exemplary alternative embodiment of a test device that may be used to verify proper installation and operation of one or more current transformers installed, for example, in the generator of FIG. 1.
Figure 5:
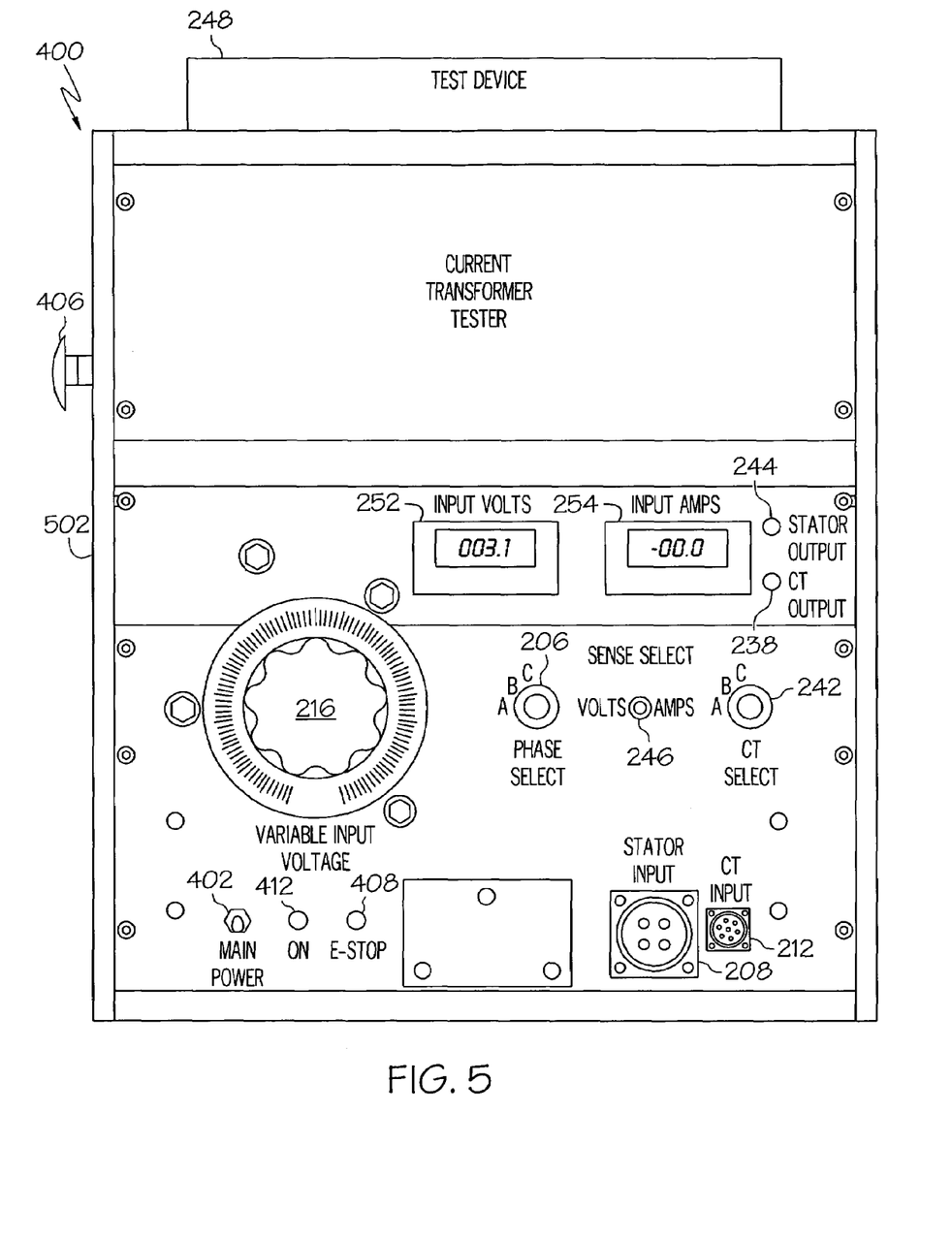
FIG. 5 depicts a front view of a particular physical implementation of the test device that is schematically illustrated in FIG. 4.

The test device 200 depicted in FIG. 2 and described above is merely exemplary of a particular, generalized functional embodiment. It will be appreciated that the test device 200 may be physically implemented according to any one of numerous configurations. For example, FIG. 4 depicts a detailed schematic representation of a particular physical implementation of the generalized embodiment shown in FIG. 2, and FIG. 5 depicts an actual physical implementation of a test device that is implemented according to the schematic representation of FIG. 4. For completeness, these actual physical implementations will now be described. In doing so, it is noted that like reference numerals in FIGS. 2, 4, and 5 refer to like parts. However, it is also noted that the nomenclature used to describe the like parts of the two different test device embodiments will, in many instances, differ. For example, although the switch labeled using reference numeral 206 implements the same function in both test devices 200, 400, this switch 206 is described using the nomenclature "current transformer primary winding select switch" when referring to the test device 200 of FIG. 2, whereas this switch 206 is described using the nomenclature "PHASE SELECT switch" when referring to the test device 400 of FIGS. 4 and 5.

In addition to the above, it may be seen from FIGS. 4 and 5 that the test device 400 depicted therein includes each of the devices and components included in the generalized test device 200 of FIG. 2, plus a few additional components and devices. In addition, some of the components and devices are depicted in FIGS. 4 and 5 in more detail than in FIG. 2. As such, the following description will include only detailed descriptions of like components that are illustrated in more detail in FIGS. 4 and 5, and those components and devices depicted in the test device 400 shown in FIGS. 4 and 5 that are not included in the generalized test device 200 of FIG. 2.

With the above background in mind, and with reference now to FIGS. 4 and 5, it is seen that the physically implemented test device 400 includes the DC power source 202, the variable AC power source 204, the current transformer primary winding select (PHASE SELECT) switch 206, the current transformer primary winding (STATOR INPUT) test jack 208, the current transformer secondary winding (CT INPUT) test jack 212, the plug 214, the user interface (VARIABLE INPUT VOLTAGE) knob 216, the solenoids 218 and associated coils 222 and contactors 224, the secondary winding test device node (CT OUTPUT) 238, the current transformer secondary winding select (CT SELECT) switch 242, the primary winding test device node (STATOR OUTPUT) 244, the AC signal parameter select (SENSE SELECT) switch 246, the load voltage (INPUT VOLTS) indicator 252, and the load current (INPUT AMPS) indicator 254.

As shown most clearly in FIG. 4, the DC power source 202 is preferably implemented as a conventional power supply device that, when a MAIN POWER switch 402 is appropriately positioned, receives and converts 120 VAC line voltage supplied to the plug 214 to about +24 VDC. This +24 VDC power is used not only to selectively energize the solenoids 218, but to also selectively energize an input power relay 404. More specifically, the test device 400 includes an E-STOP switch 406, which is mounted on a side of the test device 400 (see FIG. 5). When the MAIN POWER switch 402 is closed, 120 VAC is supplied to the DC power source 202, which in turn supplies +24 VDC. If the E-STOP switch 406 is open, then the input power relay 404 will not be energized and a front-mounted E-STOP indicator 408 will be illuminated with the 120 VAC. If, however, the E-STOP switch 406 is closed, then the input power relay 404 will be energized and a front-mounted MAIN POWER indicator 412 will be illuminated with the 120 VAC. The E-STOP switch 406 allows the test device 400 to be de-energized regardless of the position of the MAIN POWER switch 402.

In addition to selectively coupling the 120 VAC main power to the DC power source 202 and either the E-STOP indicator 408 or the MAIN POWER indicator 412, the MAIN POWER switch 402 additionally selectively couples the 120 VAC main power to the variable AC power source 204, the load voltage (INPUT VOLTS) indicator 252, the load current (INPUT AMPS) indicator 254, and a cooling fan 414 that is used to circulate air in and through the test device chassis 502 (see FIG. 5). It will be appreciated that the 120 VAC power to the indicators 252, 254 is operational power.

The variable AC power source 204 functions as previously described, but in the depicted embodiment is implemented using a variable winding transformer 416. The variable winding transformer 416 includes a variable primary winding 418 and a secondary winding 422. The variable primary winding 418 is coupled to receive the 120 VAC main power via the input relay 404, and induces an AC signal in the secondary winding 422. The voltage magnitude of the AC signal in the secondary winding 422 will vary with the position of the user interface (VARIABLE INPUT VOLTAGE) knob 216, which is coupled to, and used to vary, the voltage across the variable primary winding 418.

As in the generalized embodiment, the output of the AC power source 204, which in FIG. 4 is the variable transformer secondary winding 422, is coupled to the current transformer primary winding (STATOR INPUT) test jack 208 common pin 228 and each of the solenoid contactors 224. However, unlike the previous embodiment, the test device 400 of FIG. 4 includes a plurality of load resistors 424. In the depicted embodiment, the device 400 includes four load resistors 424 (e.g., 424-1, 424-2, 424-3, 424-4). It will nonetheless be appreciated that this is merely exemplary, and that the test device 400 could be implemented with more or less than this number of load resistors 424, so long as the resistance is sufficient to limit the load current supplied to the stator windings 135 or current transformer primary windings.

The current transformer secondary winding (CT INPUT) test jack 212, the secondary winding test device node (CT OUTPUT) 238, the current transformer secondary winding select (CT SELECT) switch 242, the primary winding test device node (STATOR OUTPUT) 244, the AC signal parameter select (SENSE SELECT) switch 246, the load voltage (INPUT VOLTS) indicator 252, and the load current (INPUT AMPS) indicator 254 are each configured to function similar to the test device 200 of FIG. 2. However, unlike the previous device 400, a burden resistor 426 (e.g., 426-1, 426-2, 426-3) is coupled in series between each pair of current transformer secondary winding (CT INPUT) test jack 212 connection pin pairs 236 and the secondary winding test device node (CT OUTPUT) 238. More specifically, a burden resistor 426 is coupled between each of the current transformer secondary winding (CT INPUT) test jack 212 connection pin pairs 236 and the current transformer secondary winding select (CT SELECT) switch 242. The burden resistors 426 reduce the current magnitude from the CTs 195 to the secondary winding test device node (CT OUTPUT) 238.

As just mentioned, the secondary winding test device node (CT OUTPUT) 238 and the primary winding test device node (STATOR OUTPUT) 244 are configured to function similar to the previous embodiment. Thus, in the depicted embodiments and as shown most clearly in FIG. 5, these nodes 238, 244 are preferably implemented as BNC connectors that are configured to be releasably coupled to the test device 248 via a non-illustrated test cable. With this particular configuration, and with continued reference to FIG. 5, the test device 248, which again is preferably a multi-channel oscilloscope, may be placed atop the test device chassis 502. It will be appreciated, as with the previous embodiment, that this configuration is merely exemplary, and that the test device nodes 238, 244 and test device 248 could be non-releasably coupled together. Moreover, the test device 248 could be permanently mounted, if so desired, within the test device chassis 502.

In addition to the differences already described, it is seen that the test device 400 of FIGS. 4 and 5 further includes a plurality of chassis-mounted terminal boards 428, a plurality of fuses 432, and an internal CT 434. The internal CT 434 is used to sense the load current supplied to the stator windings 135 and that is displayed on the load current (INPUT AMPS) indicator 254 and, if selected using the AC signal parameter select (SENSE SELECT) switch 246, on the test device 248 via the primary winding test device node (STATOR OUTPUT) 244.

The test device 400 depicted in FIGS. 4 and 5 and described above operates substantially identically to the test device 200 depicted in FIG. 2. Thus, a description of the operation of the test device 400 when it is coupled to a plurality of stator windings 135 is not needed and will not be provided.

The test devices described herein, and the method implemented by each for verifying proper CT installation and operation, does not rely on the generator (or other system) to be in a state of relatively high assembly. As a result, potentially time consuming and costly disassembly and reassembly, in the event of an improperly installed or operating CT, is avoided.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A current transformer test device for testing a plurality of current transformers each having at least a primary winding and a secondary winding, the test device comprising:
   an alternating current (AC) power source configured to supply an AC signal having at least a current magnitude;
   an AC current meter configured to measure and display the supplied AC signal current magnitude;
   a current transformer primary winding select switch movable to one of a plurality of switch positions, each switch position corresponding to one of the plurality of current transformer primary windings;
   a current transformer primary winding test jack coupled to receive the AC signal from the AC power source, the current transformer primary test jack configured to be releasably coupled to each of the current transformer primary windings and, upon being coupled thereto, to supply the AC signal to the current transformer primary winding that corresponds with the switch position of the current transformer select switch; and
   a current transformer secondary winding test jack configured to be releasably coupled to each of the current transformer secondary windings and, upon being coupled thereto, to receive a current transformer test signal from one of the current transformer secondary windings when its associated current transformer primary winding is supplied with the AC signal.

2. The test device of claim 1, further comprising:
   a secondary winding test device node adapted to be coupled to a test device; and
   a current transformer secondary winding select switch coupled between the current transformer secondary winding test jack and the secondary winding test device node, the current transformer secondary winding test select switch configured to selectively couple one of the current transformer secondary windings to the secondary winding test device node.

3. The test device of claim 2, further comprising:
   a plurality of burden resistors coupled between the current transformer secondary winding select switch and the current transformer secondary winding test jack.

4. The test device of claim 2, wherein the AC signal further has at least a voltage magnitude, and wherein the test device further comprises:
a primary winding test device node adapted to be coupled to the test device; and
an AC signal parameter select switch coupled between the AC power source and the primary winding test device node, the AC signal parameter select switch moveable between a first position, in which a signal representative of the AC signal current magnitude is coupled to the primary winding test device node, and a second position, in which a signal representative of the AC signal voltage magnitude is coupled to the primary winding test device node.

5. The test device of claim 1, further comprising:
a plurality of solenoids, each solenoid coupled between the current transformer primary winding select switch and the current transformer primary winding test jack and including:
a contactor coupled between the AC power source and the current transformer primary winding test jack and movable between an open position and a closed position, and
a coil configured to be selectively energized based on the position of the current transformer primary winding select switch and operable, in response to being energized, to move the contactor to the closed position and thereby couple the AC signal to the current transformer primary winding test jack.

6. The test device of claim 5, further comprising:
a direct current (DC) power source coupled to the current transformer primary winding select switch and configured to supply DC power to one of the plurality of solenoid coils based on the position of the current transformer primary winding select switch.

7. The test device of claim 1, wherein the AC power source is a variable AC power source.

8. The test device of claim 7, wherein the variable AC power source comprises:
a variable transformer having variable turns ratio, the variable transformer including a variable primary winding coupled to receive an AC input signal, and a secondary winding adapted to supply the AC signal; and
a user input coupled to the variable primary winding and configured, in response to a user input, to vary the turns ratio and thereby vary the AC signal current magnitude.

9. The test device of claim 1, further comprising:
an AC voltage meter configured to measure and display a voltage magnitude of the supplied AC signal.

10. The test device of claim 1, further comprising:
one or more load resistors coupled between the AC power source and the current transformer primary winding test jack.

11. The test device of claim 1, further comprising:
a test device coupled to receive and simultaneously display signals representative of the AC signal and the current transformer test signal.

12. The test device of claim 1, further comprising:
a main power switch coupled to the AC power source and adapted to receive an input AC power signal, the main power switch movable between an on position, in which the AC power signal is electrically coupled to the AC power source, and an off position, in which the AC power signal is electrically decoupled from the AC power source.

13. The test device of claim 12, further comprising:
a second power switch coupled between the main power switch and the AC power source and movable between an on position, in which the main power switch is electrically coupled to the AC power source, and an off position, in which the main power switch is electrically decoupled from the AC power source.

14. The test device of claim 13, further comprising:
a first indicator configured to receive an energization signal when the main power switch is in the on position and the second power switch is in the off position; and
a second indicator configured to receive an energization signal when the main power switch and the second power switch are both in the on position.

* * * * *